United States Patent
Yang et al.

(10) Patent No.: US 7,488,626 B1
(45) Date of Patent: *Feb. 10, 2009

(54) THYRISTOR DEVICE WITH CARBON LIFETIME ADJUSTMENT IMPLANT AND ITS METHOD OF FABRICATION

(75) Inventors: Kevin J. Yang, Santa Clara, CA (US); Farid Nemati, Menlo Park, CA (US); Scott Robins, San Jose, CA (US); James D. Plummer, Portola Valley, CA (US); Hyun-Jin Cho, Palo Alto, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/483,859

(22) Filed: Jul. 10, 2006

Related U.S. Application Data

(60) Division of application No. 10/670,881, filed on Sep. 25, 2003, now Pat. No. 7,075,122, which is a continuation-in-part of application No. 10/231,805, filed on Aug. 28, 2002, now Pat. No. 6,653,175, which is a division of application No. 09/814,980, filed on Mar. 22, 2001, now Pat. No. 6,462,359.

(51) Int. Cl.
  *H01L 29/72* (2006.01)
(52) U.S. Cl. .................... 438/133; 438/48; 438/473
(58) Field of Classification Search ............ 438/48, 438/133, 473
  See application file for complete search history.

(56) References Cited

U.S. PATENT DOCUMENTS

| | | | |
|---|---|---|---|
| 4,177,477 A | 12/1979 | Hokuyo et al. | |
| 4,323,793 A | 4/1982 | Schutten et al. | |
| H569 H | 1/1989 | Varker et al. | |
| 5,294,816 A | 3/1994 | Shekar et al. | |
| 5,998,811 A * | 12/1999 | Huang ........................ 257/153 |
| 6,229,161 B1 | 5/2001 | Nemati et al. | |
| 6,462,359 B1 | 10/2002 | Nemati et al. | |
| 6,653,175 B1 * | 11/2003 | Nemati et al. ............... 438/133 |

OTHER PUBLICATIONS

S. Lombardo et al., "High Temperature Annealing Effects on the Electrocal Characteristics of C Implanted Si"; J. Appl. Phys. vol. 79, No. 7, pp. 3464-3469, Apr. 1, 1996.

Ibrahim Ban et al., "Effects of Carbon Implantation on Generation Lifetime in Silicon"; Appl. Phys. Lett.; vol. 68, No. 4, pp. 499-501, Jan. 22, 1996.

American Microsemiconductor, "Tunnel Diode and Back Diode Tutorial"; at www.americanmicrosemi.com/tutorials/tunneldiode.htm; Jul. 31, 2003.

Alan Seabaugh; "Silicon-Based Tunnel Diodes and Integrated Circuits"; University of Notre Dame; at www.nd.edu/~nano/0a1003QFDpaper_v1.pdf; Jul. 31, 2003.

* cited by examiner

*Primary Examiner*—Edward Wojciechowicz
(74) *Attorney, Agent, or Firm*—Fields IP, PS

(57) ABSTRACT

In a method of fabricating a semiconductor memory device, a thyristor may be formed in a layer of semiconductor material. Carbon may be implanted and annealed in a base-emitter junction region for the thyristor to affect leakage characteristics. The density of the carbon and/or a bombardment energy and/or an anneal therefore may be selected to establish a low-voltage, leakage characteristic for the junction substantially greater than its leakage absent the carbon. In one embodiment, an anneal of the implanted carbon may be performed in common with an activation for other implant regions the semiconductor device.

1 Claim, 16 Drawing Sheets

US 7,488,626 B1

THYRISTOR DEVICE WITH CARBON LIFETIME ADJUSTMENT IMPLANT AND ITS METHOD OF FABRICATION

RELATED DATA

This application is a divisional of U.S. patent application Ser. No. 10/670,881 filed Sep. 25, 2003 now U.S. Pat. No. 7,075,122, which is a continuation in part of U.S. patent application Ser. No. 10/231,805 filed Aug. 28, 2002, now U.S. Pat. No. 6,653,175, which is a divisional of U.S. patent application Ser. No. 09/814,980 filed Mar. 22, 2001, now U.S. Pat. No. 6,462,359 and issued Oct. 8, 2002. The disclosures of all these applications are hereby incorporated by reference in their entirety.

FIELD OF THE INVENTION

The present invention is directed to semiconductor devices and, more specifically, to semiconductor devices including thyristor-based memory and to carbon lifetime adjustment implants to enhance leakage currents and stabilize operations thereof.

BACKGROUND

The semiconductor industry has recently experienced technological advances that have permitted dramatic increases in integrated circuit density and complexity, and equally dramatic decreases in power consumption and package sizes. Present semiconductor technology may now permit single-die microprocessors with many millions of transistors, operating at speeds of hundreds of millions of instructions per second, to be packaged in relatively small semiconductor device packages. As the use of these devices has become more prevalent, the demand for faster operation and better reliability has increased.

An important part in the circuit design, construction, and manufacture of semiconductor devices concerns semiconductor memories; the circuitry used to store digital information. Conventional random access memory devices may include a variety of circuits, such as SRAM and DRAM circuits. SRAMs are mainly used in applications that require a high random access speed and/or a CMOS logic compatible process. DRAMs, on the other hand, are mainly used for high-density applications where the slow random access speed of DRAM can be tolerated.

Some SRAM cell designs may be based on NDR (Negative Differential Resistance) devices. They usually consist of at least two active elements, including an NDR device. The NDR device is important to the overall performance of this type of SRAM cell. A variety of NDR devices have been introduced ranging from a simple bipolar transistor to complicated quantum-effect devices. One advantage of the NDR-based cell is the potential of having a cell area smaller than conventional SRAM cells (e.g., either 4T or 6T cells) because of the smaller number of active devices and interconnections. Many of the NDR-based SRAM cells, however, have many problems that have prohibited their use in commercial SRAM products. Some of these problems include: high standby power consumption due to the large current needed in one or both of the stable states of the cell; excessively high or excessively low voltage levels needed for the cell operation; stable states that are too sensitive to manufacturing variations and provide poor noise-margins; limitations in access speed due to slow switching from one state to the other; limitations in operability due to temperature, noise, voltage and/or light stability and manufacturability and yield issues due to complicated fabrication processing.

A novel type of NDR-based SRAM ("TCCT RAM") has been recently introduced that can potentially provide the speed of conventional SRAM at the density of DRAM in a CMOS compatible process. This new SRAM cell uses a thin capacitively-coupled NDR device and more specifically a thin capacitively-coupled thyristor ("TCCT") to form a bi-stable element for the SRAM cell. For more details of specific examples of this new device, reference may be made to: "A Novel High Density, Low Voltage SRAM Cell With A Vertical NDR Device," VLSI Technology Technical Digest, June, 1998; "A Novel Thyristor-based SRAM Cell (T-RAM) for High-Speed, Low-Voltage, Giga-Scale Memories," International Electron Device Meeting Technical Digest 1999, and "A Semiconductor Capacitively-Coupled NDR Device And Its Applications For High-Speed High-Density Memories And Power Switches," PCT Int'l Publication No. WO 99/63598, corresponding to U.S. patent application Ser. No. 09/092,449, now U.S. Pat. No. 6,229,161. Each of these documents is incorporated by reference in its entirety.

An important design consideration in any type of thyristor-based memory cell, including the TCCT RAM cell, is the holding current of the thyristor. The holding current of the thyristor is the minimum current that may keep the thyristor in the forward conducting state. This holding current has to be sufficiently low so that the memory cell may have an acceptable standby current. For example, a holding current larger than a few—nano-Amperes per cell could significantly impact its power dissipation and limit the maximum capacity of a thyristor-based memory.

Another important consideration when using a thyristor-based memory cell is the sensitivity of the blocking state of the thyristor to various adverse conditions such as noise, light, anode-to-cathode voltage changes and high temperatures. These sensitivities can affect the operation of the thyristor, which may result in undesirable turn-on and may disrupt the contents of the memory cell.

During manufacture of the memory various doping, implant, activation and anneal procedures may be performed. Additionally, masking may be used during patterning for the doping and implant provisions, as well as for patterning for other structures, such as polysilicon for the electrodes. A number of procedures—e.g., patterning, masking, doping, implanting, siliciding annealing, etc.—during fabrication of the thyristor memory may contribute to its overall complexity, cost and size. Accordingly, manufactures may strive to reduce the number of procedures in an overall fabrication for streamlining manufacturing and lowering costs.

SUMMARY

In accordance with an embodiment of the present invention, a semiconductor device may include a layer of semiconductor material with a thyristor formed therein. The thyristor may comprise at least one emitter-base junction with carbon disposed across the base-emitter junction. In a particular aspect, the carbon may comprise a density and/or annealed structure across the junction sufficient to establish a low-voltage, leakage characteristic substantially greater than the leakage characteristic therefor absent the carbon. In a further embodiment, the thyristor may comprise N-P-N-P doped regions in a layer of silicon for respective cathode, P-base, N-base, and anode regions. Each of the base-emitter junctions, for the respective anode to N-base and cathode to P-base boundaries may comprise carbon-silicon self-interstitial type defects for effecting the low-level leakage characteristics. In yet a further embodiment, the density of the carbon and/or the annealed structure thereof, within at least one base-emitter junction, may be sufficient to substantially reduce the gain of a bipolar transistor associated with junction within the thyristor relative to the gain therefor absent the carbon.

In accordance with another embodiment of the present invention, a thyristor memory device may comprise a thyristor in semiconductor material having an anode/cathode, a cathode/anode, and first and second base regions disposed between the anode/cathode and the cathode/anode. The first base-emitter junction may be defined between the anode/cathode and the first base region. A second base-emitter junction region may be defined between the cathode/anode and the second base. Carbon-type defects may be disposed within the first base-emitter junction. Further, the carbon-type defects may comprise an average diameter less than a nanometer. In a particular embodiment, the carbon-type defects may be formed by an anneal of the semiconductor material while the carbon is disposed therein. Further, the carbon-type defects may comprise a density and be formed using a temperature and duration for the anneal sufficient to establish a non-ideal I-V characteristic for the junction in its lower-voltage bias region. In yet a further embodiment, a bipolar transistor of a thyristor associated with the first base-emitter junction region may comprise a gain of magnitude substantially less than the ideal gain therefor absent the carbon-type defects.

In another embodiment of the present invention, a semiconductor memory device may comprise an access transistor formed in semiconductor material. A capacitively-coupled thyristor may be accessible via the access transistor and may comprise a cathode/anode region also formed in the semiconductor material and electrically coupled to a drain/source region of the access transistor. At least one base-emitter junction of the capacitively-coupled thyristor may be disposed electrically in series with the anode/cathode as formed in the semiconductor material. Further, carbon may be disposed in the base-emitter junction region to establish a leakage parameter therefor. In a particular embodiment, the carbon may be implanted with an implant dosage and processed with anneal temperature sufficient for creating carbon-silicon, self-interstitial type complexes within the base-emitter junction region for reducing a lifetime of minority carriers therein. In a further embodiment, the carbon-silicon self-interstitial type complexes may define a lifetime parameter for minority carriers within the base-emitter junction region with a magnitude substantially less than that for intrinsic silicon.

In yet a further embodiment of the present invention, a method of fabricating a semiconductor device may comprise implanting dopant into semiconductor material for forming at least one of anode, N-base, P-base and cathode regions for a thyristor. Carbon may be implanted into select regions of the semiconductor material and across at least one of a first junction region and a third junction region. The first junction region may comprise an area between the anode and N-base regions, while the third junction region may comprise an area between the cathode and P-base regions. During the implanting of the carbon, a mask may be disposed over the semiconductor material to protect (from the carbon implant) a second junction region formed between the N-base and P-base regions. Additionally, the semiconductor material may be annealed to activate the dopant implants and to form carbon-type defects from the implanted carbon across the at least one of the first and third junction regions. In a further embodiment, the carbon may be implanted across each of the first and the third junction regions. Additionally, the activation of dopant and the formation of the carbon-type defects may share a common anneal.

In a further embodiment, the implanting of the carbon into the semiconductor material may comprise using an edge of a mask for an alignment of the carbon implant. Additionally, an angle and energy of incidence for the implanting of the carbon may define a lateral extent therefor beneath the mask to be less than that for an implant of the N-base region. In a particular aspect of one embodiment, the density and/or anneal for the carbon implants may be sufficient to effect a low-voltage leakage characteristic in one of the first and third junctions to be substantially greater than the leakage therefor absent the carbon. Additionally, the density and/or anneal for the carbon implants may establish a gain for at least one of the bipolar transistors associated with the thyristor that may be substantially less than the gain therefor absent the carbon over its low-bias range.

BRIEF DESCRIPTION OF THE DRAWINGS

Subject matter of embodiments of the present invention may be understood by reference to the following detailed description and with reference to the accompanying drawings, in which.

DETAILED DESCRIPTION

Figure 1:
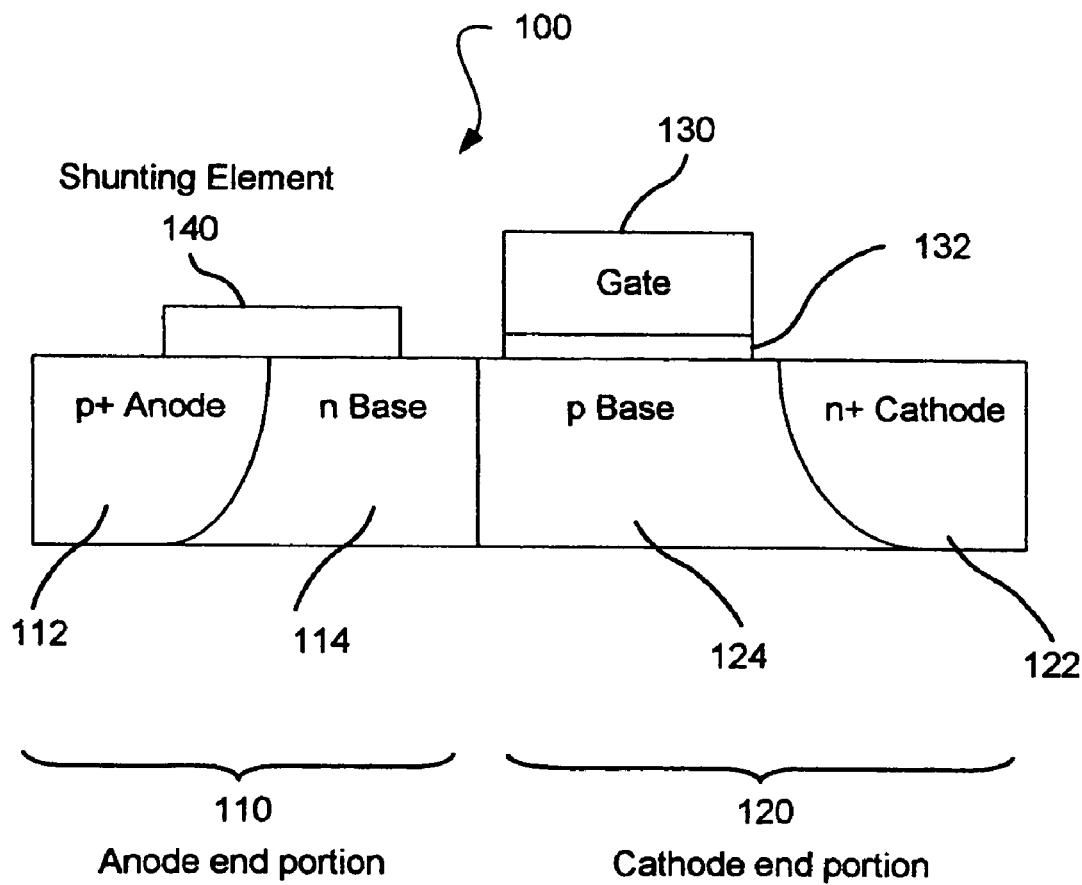
FIG. 1 is a simplified cross-sectional view of a portion of a thyristor for a thyristor-based memory according to an embodiment of the present invention, illustrating a shunting element across a boundary between an emitter region and a base region of the thyristor.

In the description that follows, readily established circuits and procedures for the exemplary embodiments may be disclosed in simplified form (e.g., simplified block diagrams and/or simplified description) to avoid obscuring an understanding of the embodiments with excess detail and where persons of ordinary skill in this art can readily understand their structure and formation by way of the drawings and disclosure. For the same reason, identical components may be given the same reference numerals, regardless of whether they are shown in different embodiments of the invention.

Embodiments of the present invention may be applicable to a variety of different types of thyristor-based memories, and have been found to be particularly useful for such devices benefiting from improved stability in the presence of disturbing environmental conditions such as high temperature, noise, voltage changes and light. While the present invention is not necessarily limited to such devices, various aspects of the invention may be appreciated through a discussion of various examples of this context.

As used herein, "substrate" or substrate assembly may be meant to include, e.g., a portion of a semiconductor wafer. Such portion may have one or more layers of material including, but not limited to Si, Ge, SiGe, and all other semiconductors that have been formed on or within the substrate. Layered semiconductors comprising the same or different semi-conducting material such as Si/Si, Si/SiGe and silicon-on-insulator (SOI) may also be included. These layers and/or additional layers may be patterned and/or may comprise dopants to produce devices (e.g., thyristors, transistors, capacitors, interconnects, etc.) for an integration of circuitry. In forming these devices, one or more of the layers may comprise topographies of various heights. When referencing this integration of circuitry, therefore, it may be described as integrated together, on or with the substrate.

Furthermore, those skilled in the art will recognize that although embodiments of the present invention may describe fabrication for a particular sequence of dopant polarities, these dopant type(s) and the doped regions of a substrate may be reversed to form devices of opposite relative conductivity types—e.g., an N-type MOS transistor might be fabricated in such alternative embodiment for opposite conductivity type dopants so as to realize a P-type MOS transistor. Likewise, a thyristor may be described for an embodiment with an order of anode-emitter, N-base, P-base and cathode-emitter, wherein the anode-emitter may be attached, e.g., to a reference voltage and the cathode-emitter may be in common with a source/drain region of an access transistor. It will be understood that for the opposite relative conductivity embodiments, the cathode-emitter might be electrically coupled to a reference voltage and the anode-emitter in common with an access transistor of opposite type channel.

As referenced herein, portions of (e.g., a transistor or thyristor) may be described as being formed in, at or on a semiconductor substrate. Such alternative terms in/at/on may be used individually merely for purposes of convenience. In the context of forming semiconductor devices, such terms may collectively reference portions of a semiconductor element that may be within and/or on a starting material.

According to one embodiment, a thyristor-based memory application may provide stable operation over a range of conditions, which may include noise, radiation, and deviation in voltage and temperature. A base region in one or both ends of the anode and cathode portions of the thyristor may include a shunting element to shunt a low-level current, which may enhance the thyristor's immunity to environmental influences and assure that transitions between on and off states occur only in response to appropriate write and/or access control signals.

In another embodiment, a thyristor-based memory may comprise an array of memory cells. A memory cell of the array may comprise a capacitively-coupled thyristor and a transistor to selectively access the thyristor. The thyristor may comprise anode and cathode end portions and each end portion may include an emitter region and a base region in contact with the emitter region. To enhance stability of operation and reliability for data retention of the thyristor, a current-shunt may shunt a low-level leakage current through a base region, which in turn may guard against inadvertent switching of states.

Various designs for low-level current shunts may employ different mechanisms for stabilizing thyristor operations. In general, the current shunt may establish a holding-current sufficient for maintaining the thyristor in an ON condition; and to guard against its inadvertent switching from an OFF state to an ON state in the presence of environmental influences. At the same time, the design may also consider aims to limit power dissipation.

Selection of the particular current shunt, its construction and location may be based upon the design considerations of a given application. In some embodiments, the shunt may be disposed between or across a boundary of a base region and its adjacent emitter region. In other embodiments, the shunt may be disposed between a base region and a separate node (e.g., internal, external or common to many cells) that may receive an appropriate voltage (higher or equal to the voltage of the adjacent emitter) sufficient for drawing the low-level current. Combinations of these approaches might also be used.

Referencing FIG. 1, a capacitively-coupled thyristor 100 of a thyristor-based memory, such as a thyristor-RAM cell, may comprise low-level current shunt 140. Anode 110 and cathode 120 end portions of the thyristor may comprise respective emitter regions 112 or 122 and base regions 114 or 124. Current shunt 140 may be electrically connected across the boundary of emitter region 112 and base region 114. For the cathode end portion 120 of the thyristor, electrode 130 may be disposed over P-base region 124 via dielectric 132. Current shunt 140 may conduct a low-level current sufficient to stabilize thyristor 100 over a wide range of environmental conditions. Current shunt may bias the thyristor with a holding-current sufficiently low, e.g., a few nano-Amperes, to allow for a low standby current and low overall power dissipation. In one example, the current shunt may comprise a resistance in the range of a few mega-ohms to a few giga-ohms.

Various materials and processes can be used to form the shunt. For example, a high-resistivity material, such as undoped or lightly doped polysilicon or amorphous silicon can be used. This approach is compatible with mainstream silicon CMOS technology. Alternatively, a low resistance material can be used for the shunt, which may form a low-resistance contact to one region while forming a high-resistance contact to another region. For example, some materials are capable of providing an ohmic contact to a highly doped region, such as emitter region 112, while providing a high-resistance contact to base region 114.

Figure 2:
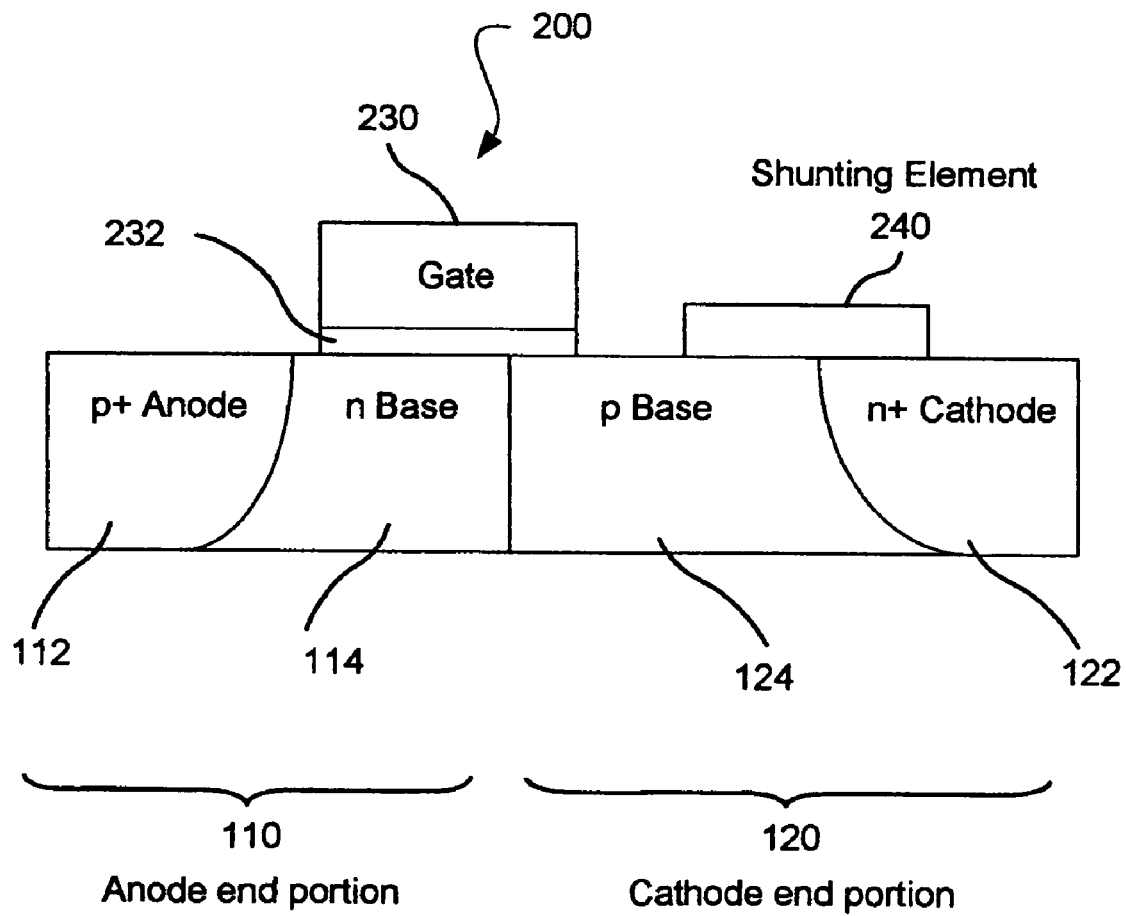
FIG. 2 is a simplified cross-sectional view of a portion of a thyristor for a thyristor-based memory according to another embodiment of the present invention, showing a shunting element across a boundary between an emitter region and a base region of the thyristor.

In another embodiment, referencing FIG. 2, current shunt 240 may extend across the boundary between P-base 124 and cathode-emitter 122 to cathode end 120. Electrode 230 of the capacitively-coupled thyristor 200 may be disposed over N-base 114 via dielectric 232. It may be noted that similar portions of thyristor 200 of this embodiment (FIG. 2) may be similar to those described with reference to FIG. 1, and may be labeled using a related numbering scheme.

Continuing with further reference to FIGS. 1 and 2, in a particular embodiment, the thyristors may comprise anode and cathode end portions 110 and 120 of respective anode-emitter and base regions 112, 114, and cathode-emitter and base regions 122, 124 disposed generally in a horizontal plane. Shunting element 140/240 may be formed to extend across the boundary(s) of the emitter and base regions of the illustrated embodiments as well as a variety of alternative thyristor structures. For example, the shunting element might also be applied to vertical or mixed vertical/horizontal thyristor structures.

For other embodiments, as may be described below relative to FIGS. 3-8, the illustrated embodiments for the exemplary shunting element could similarly be applied to the alternative vertical or mixed vertical/horizontal configurations. Likewise, these thyristor embodiments could be modified so that the shunt element could be coupled to either the anode end portion or the cathode end portion.

Figure 3:
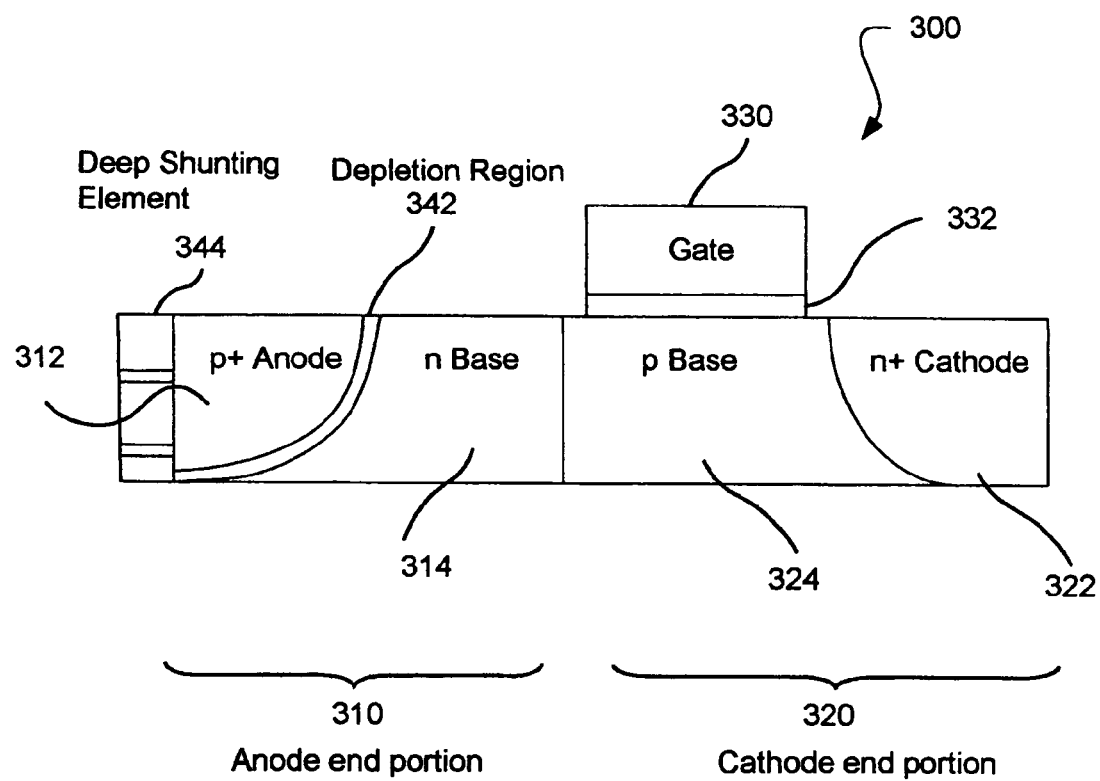
FIG. 3 is a simplified cross-sectional view of a portion of a thyristor for a thyristor-based memory according to another embodiment of the present invention, showing a depletion region between a base region and an emitter region of the thyristor and a deep shunting element along an end of the anode.

Referencing FIG. 3, another embodiment of the present invention may comprise capacitively-coupled thyristor 300 with a shunting element to enable a leakage current to flow between the base and emitter 314, 312 regions to the anode end portion 310. An electrode 330 may be disposed over base region 324 with dielectric 332 therebetween. In this embodiment, the shunt may comprise contact region 344 to contact anode 312 and another region to contact depletion region 342, which may extend and be defined between N-base region 314 and emitter region 312. Contact portion 344 of the shunt may be formed to directly contact emitter region 312; on the other hand, the second portion of the shunt may resistively contact base region 314 via depletion region 342. In a particular embodiment, depletion region 342 may conduct a leakage current between N-base region 314 and contact region 344. Additionally, the depletion region may be formed to effect a resistive connection to the base region of resistance comparatively higher than that for the resistive connection to the emitter region. For example, a P+ emitter region may be formed with depth shallower than that for the shunting contact, and may comprise a depth that is short of the depletion region between the P+ emitter region and the N-base region.

In another embodiment, a tunnel junction may be formed between a base region and an emitter region for a capacitively-coupled thyristor. Referencing FIG. 4a, a tunnel junction region 440 may be formed by heavily doping an N+ region proximate the P+ anode region 412 sufficiently so as to act as a tunnel diode. The heavily doped N+ region for the tunnel junction region 440 may be formed between the N-base region 414 and P+ emitter region 412 to the anode end portion 410 of thyristor 400. The junction may also comprise leakage current properties, which may further enhance stability of the thyristor. In a particular embodiment, the tunneling and leakage current properties may be designed to establish a holding current of the thyristor at an acceptably low level.

Figure 4A:
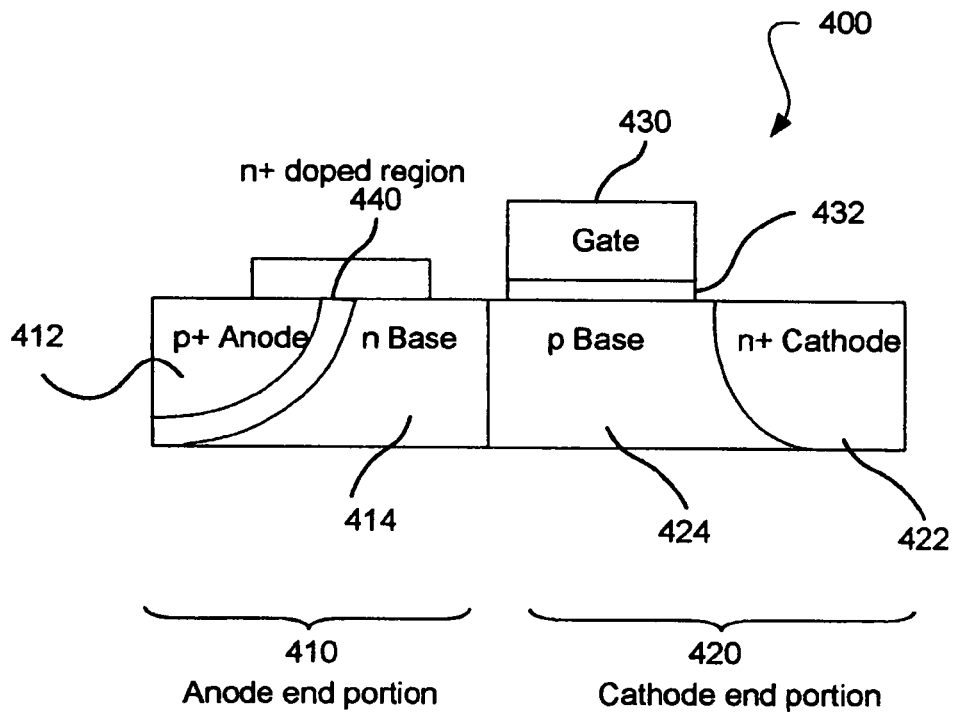
FIG. 4a is a simplified cross-sectional view of a portion of a thyristor for a thyristor-based memory according to another embodiment of the present invention, showing a tunnel diode region disposed between N-base and emitter regions to an anode end of the thyristor.

Further referencing FIG. 4a, cathode end portion 420 of thyristor 400 may comprise P-base region 424 in contact with the N+ cathode-emitter region 422. Electrode 430 may be disposed over and capacitively-coupled to P-base region 424 via dielectric 432. In this embodiment, the extent of the electrode 430 may reside laterally within and between boundaries defined by a lateral extent of P-base 424.

Figure 4B:
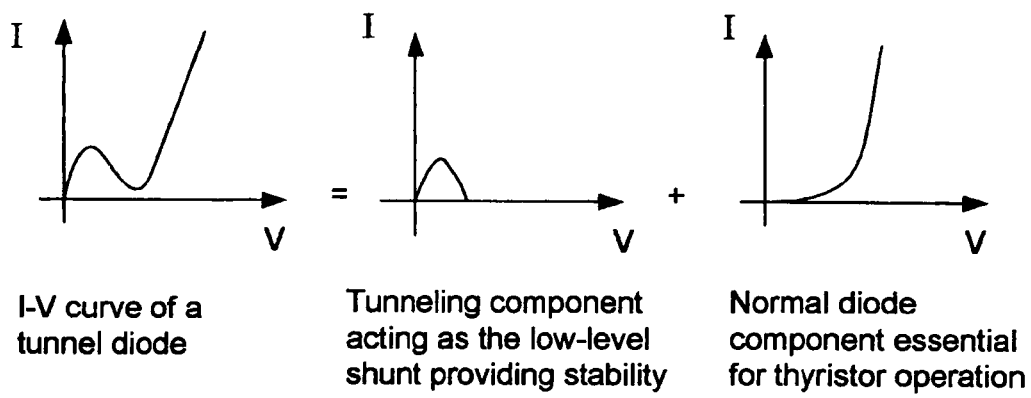
FIG. 4b shows current-voltage graphs useful in developing an understanding of characteristics to particular embodiments of the present invention for a thyristor.

Referencing FIG. 4b, the current vs. voltage (I-V) curve of a tunnel junction may be represented by two contributing components: a tunneling current component and a normal diode current component. The two components combined may emulate the operation of the thyristor. For more information regarding the operation of a tunnel diode as a thyristor emitter, reference may be made to Z. S. Gribnikov et al., Solid-State Electronics, Vol. 42, No. 9, pp. 1761-1763, 1998.

Figure 5A:
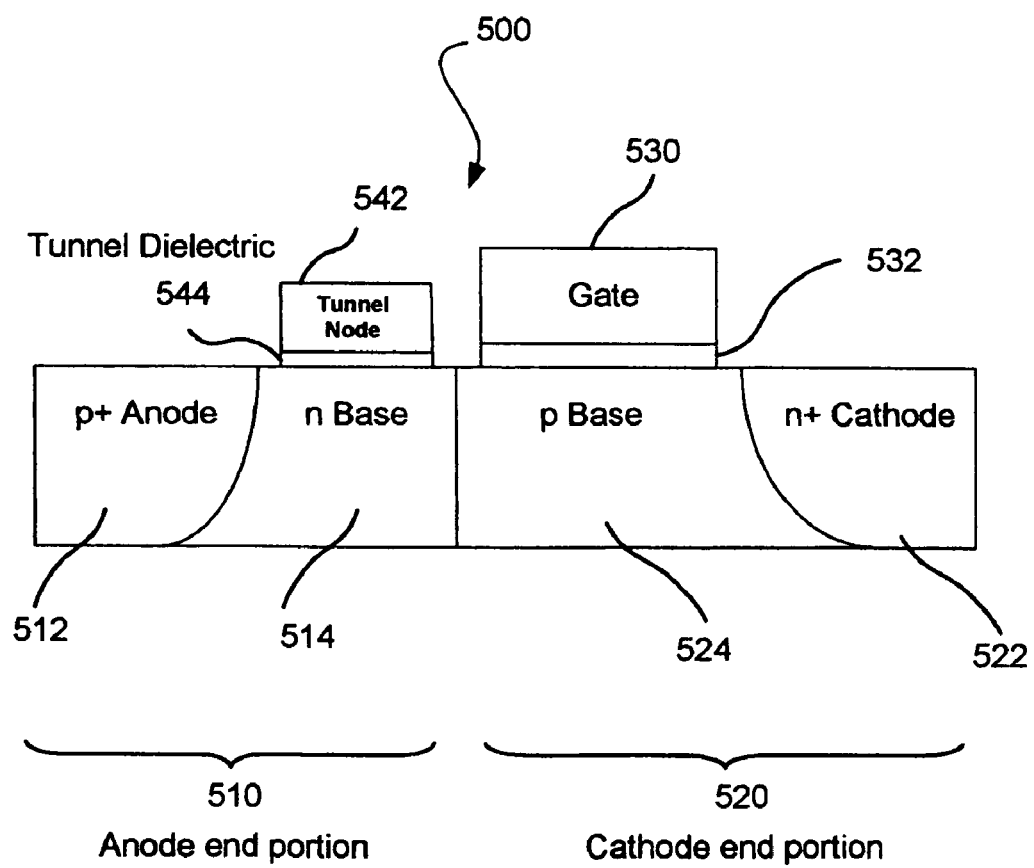
FIG. 5a is a simplified cross-sectional view of a portion of a thyristor according to another embodiment of the present invention, showing a tunnel node and tunnel dielectric over a base region of the thyristor.

In another embodiment of the present invention, referencing FIG. 5a, capacitively-coupled thyristor 500 may comprise anode end portion 510 having anode-emitter region 512 contacting N-base region 514. A tunnel node 542 and tunnel dielectric 544 may be formed over base region 514. The tunnel node may be described as being resistively coupled to base region 514 via a tunneling current that may be established through tunnel dielectric. Tunnel dielectric 544 may be formed sufficiently thin (in one example, about 30 angstroms) to permit a leakage current passage between the base region and the tunnel node. Thyristor 500 may further comprise cathode end portion 520, in which P-base region 524 may be formed in contact with the cathode-emitter region 522. An electrode 530 may be capacitively-coupled via dielectric 532 to base region 524 of the cathode end portion 520.

Figure 5B:
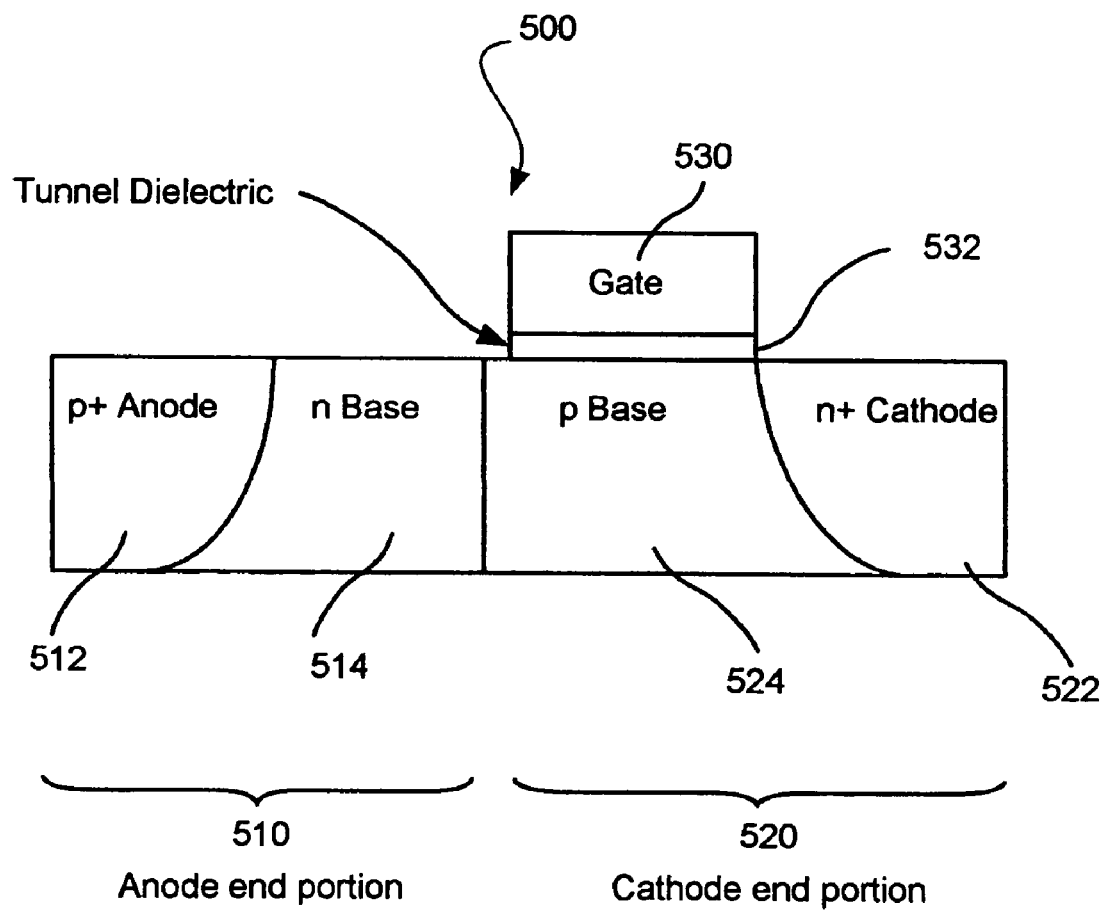
FIG. 5b is a simplified cross-sectional view to a portion of a thyristor according to another embodiment of the present invention, showing a capacitively-coupled electrode for assisting operation of the thyristor.

FIG. 5b shows another embodiment of the present invention, which may be contrasted relative to the embodiment represented by FIG. 5a. In FIG. 5b relative to FIG. 5a, electrode 530 and dielectric 532 may be operable with tunneling qualities (like tunnel node 542 and tunnel dielectric 544 of FIG. 5a) as well as lending capacitance characteristics.

Figure 6:
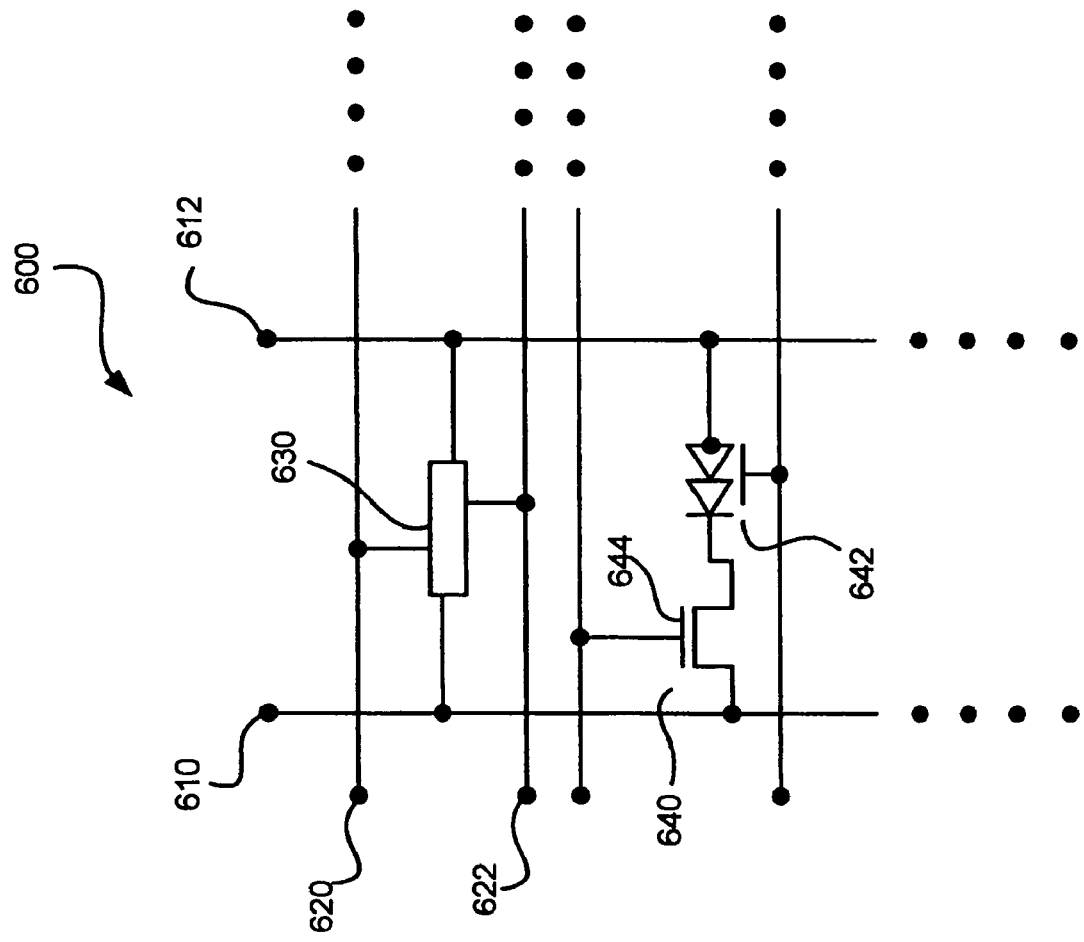
FIG. 6 is a simplified schematic diagram of a portion of a memory device, according to an embodiment of the present invention, showing thyristor-based memory cells.

The above and other examples may be applicable to a variety of semiconductor implementations and applications, including an embodiment represented by FIG. 6. Referencing FIG. 6, a memory device 600 may comprise an array of memory cells such as cell 630. The memory cell may comprise a thyristor with a current shunt for establishing a low-level current with a base region of either the anode or the cathode end of the thyristor. For example, the memory cell may comprise a thyristor according to one of the various embodiments described herein. As presented in FIG. 6, the memory device 600 may comprise least one of the representative memory cell 630, which may comprise thyristor 642 accessible to bitline 610 via access transistor 640. In this embodiment, the anode of the thyristor may be coupled to reference line 612 to receive a reference voltage. The capacitor electrode of the capacitively-coupled thyristor may be electrically coupled to a second wordline, such as that illustrated by line 622 in FIG. 6. The gate to the access transistor 640 may be electrically coupled to a first wordline, such as that illustrated by line 620 in FIG. 6. The first and second wordlines 620, 622 and the bitline and reference bitline 610, 612 of a memory cell may be repeated both horizontally and vertically across an area to establish a memory array, as represented for memory device 600 of FIG. 6.

Figure 7:
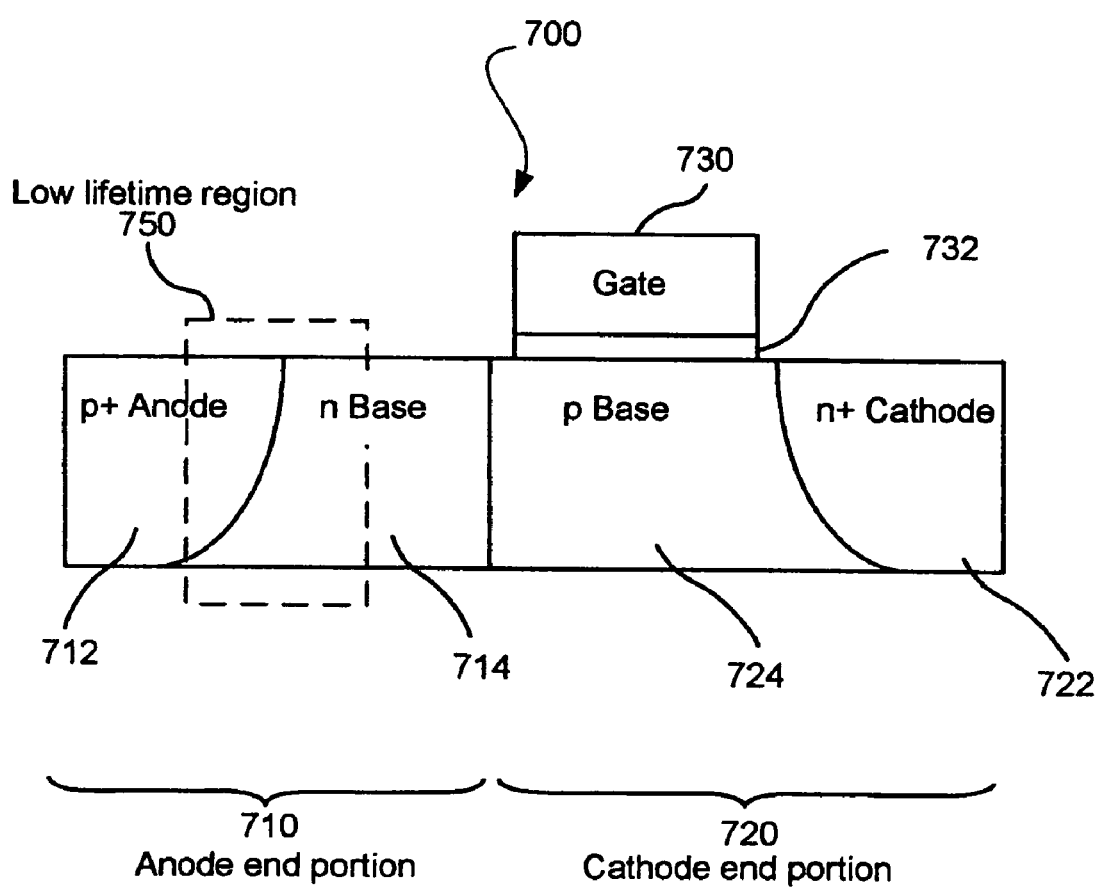
FIG. 7 is a simplified cross-sectional view to a portion of a thyristor, according to another embodiment of the present invention, showing a low-lifetime region across an anode-emitter junction region of the thyristor.

Referencing FIG. 7, in accordance with another embodiment of the present invention, a thyristor may comprise lifetime adjustment region 750 across at least one base-emitter junction. In some embodiments, such regions may be formed across both base-emitter junctions. The lifetime adjustment region 750 may be formed by implant of lifetime adjustment species effective to lower an effective lifetime duration of minority-carriers. This reduction in the lifetime of minority-carriers effected by the adjustment implants, especially in the base-emitter depletion region, may be characterized as establishing a low-level shunting or leakage current operable to (i) stabilize operation of the thyristor and (ii) affect a holding current for the thyristor. In a particular embodiment, the species, dosage and energy of the implant for the lifetime adjustment species in this region may be determined with appropriate levels therefor as may be effective to stabilize the thyristor operation and, at the same time, maintain the sufficiently low holding current.

For particular embodiments, the effective minority carrier lifetime in the low lifetime region 750 across the base-emitter boundary may be realized by a variety of different methods. For example, poly-crystalline, amorphous, or re-crystallized material may be formed in the region to affect the leakage characteristics across the base-emitter junction. Crystalline damage may be formed by particle irradiation or ion implantation. In further embodiments, the incorporation of species into the silicon may lower the lifetime of the minority carriers and will affect leakage. These species may include, e.g., Germanium, Gold, and Platinum. In a particular embodiment, the lifetime adjustment implant species may comprise carbon, as will be described more fully hereinafter.

Figure 8:
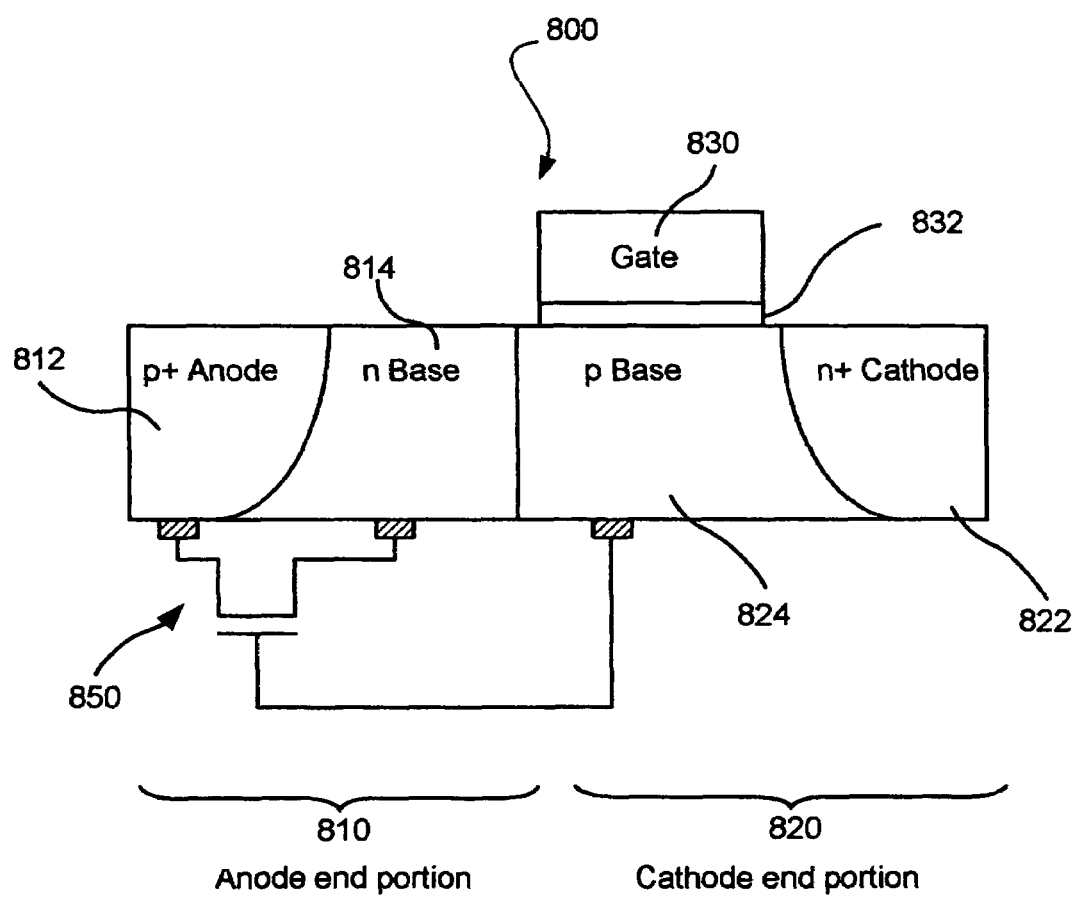
FIG. 8 is a simplified cross-sectional view and schematic diagram of a thyristor, according to an embodiment of the present invention, as may be used with a thyristor-based memory cell and showing a FET to electrically shunt a low-level current.

In accordance with another embodiment, referencing FIG. 8, an N-channel MOSFET 850 may be configured to allow shunting of current between P+ anode 812 and N-base 814 of a capacitively-coupled thyristor 800. In this embodiment, the source/drain, drain/source and gate of the MOSFET may be electrically connected to the respective anode, N-base, and P-base regions of the thyristor. In operation, when the thyristor may be forward biased, a voltage difference between the gate and source of the MOSFET may be relatively small (such as 0.1V to 0.2V). Therefore, the MOSFET may be biased to pass a very small current and, at the same time, the holding current of the thyristor may be kept acceptably low. In the alternative forward blocking condition, the thyristor may provide a high voltage difference between the gate and source of the MOSFET (almost equal to the anode to cathode voltage of the thyristor) to establish a low resistance for the MOSFET. Accordingly, the MOSFET may establish a strong shunt between the anode and N-base to establish stability for the thyristor in the blocking state—i.e., stable against high temperature, noise and other environmental disturbances. In an alternative embodiment, the gate of the NMOSFET can be independently controlled rather than being electrically connected to the P-base region. Other embodiments regarding the use of a FET in combination with a thyristor can be found in U.S. Pat. No. 4,323,793, which is fully incorporated herein by reference.

Figure 9A:
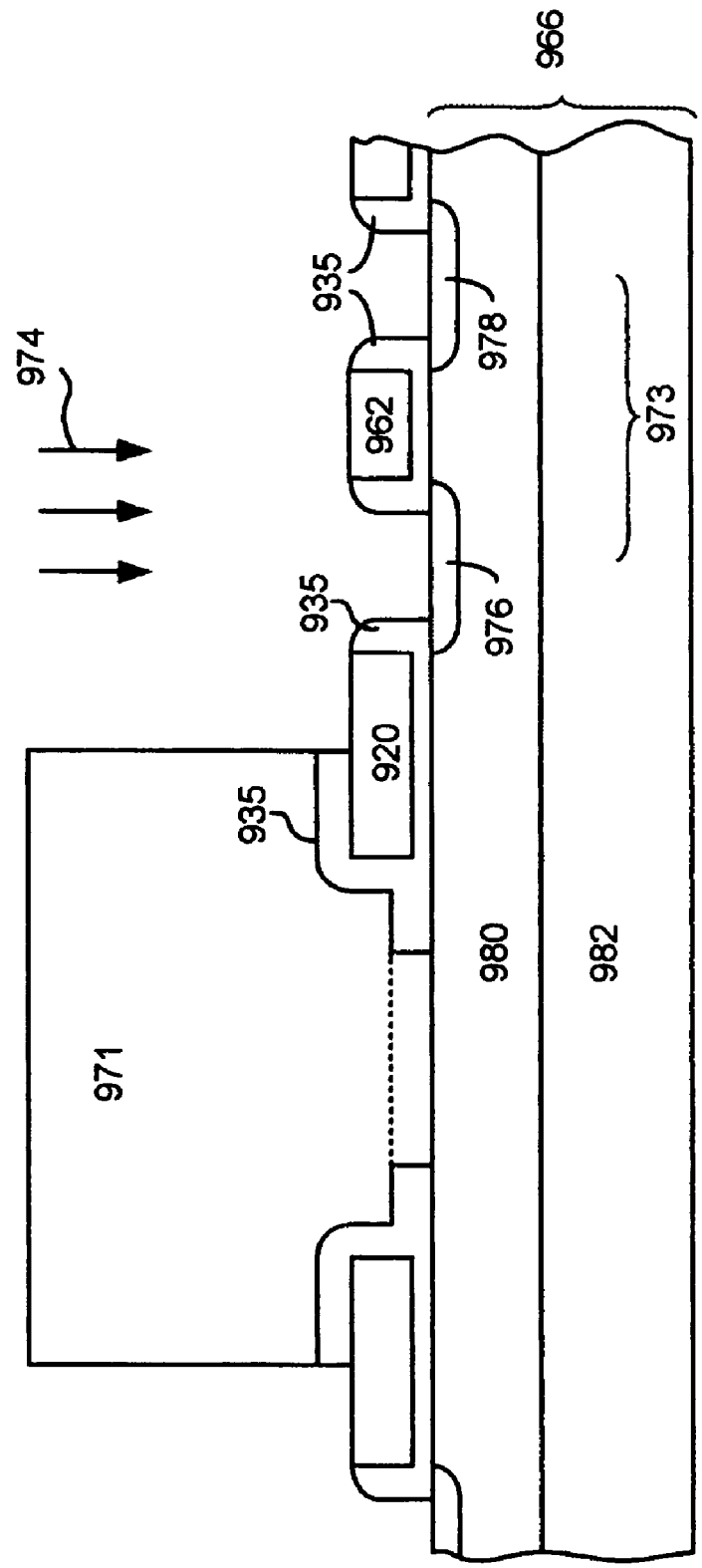
FIG. 9A is a cross sectional view of a portion of a semiconductor device in a stage of processing, useful to describe a method of processing a semiconductor device for an embodiment of the present invention, and showing extension regions about a gate electrode to an access transistor for a thyristor memory.
Figure 9B:
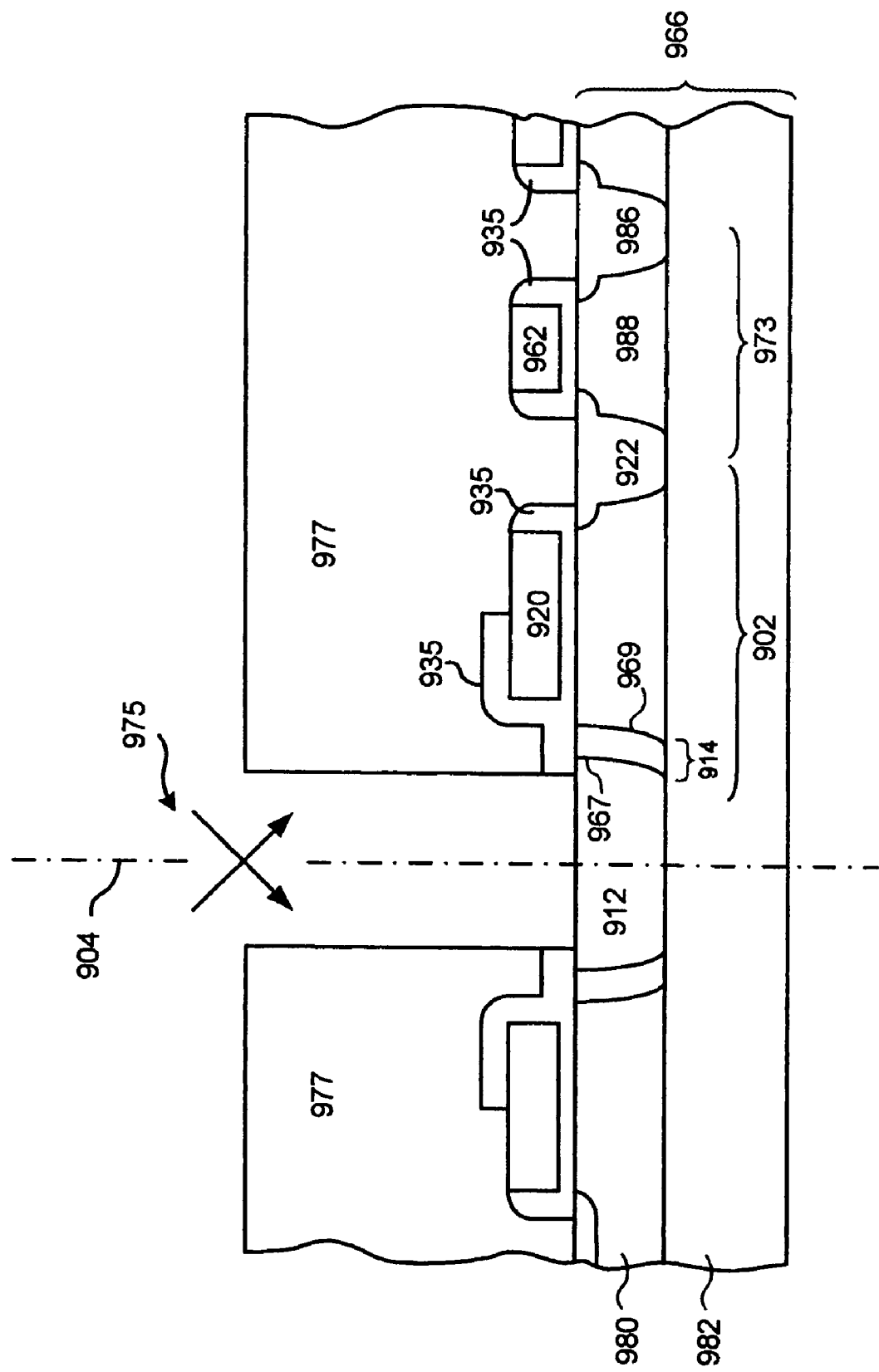
FIG. 9B is a cross sectional view of a portion of a semiconductor device of FIG. 9B, in another stage of processing and showing an implant to define at least one of a base region and an anode/cathode-emitter region for a thyristor memory.
Figure 9C:
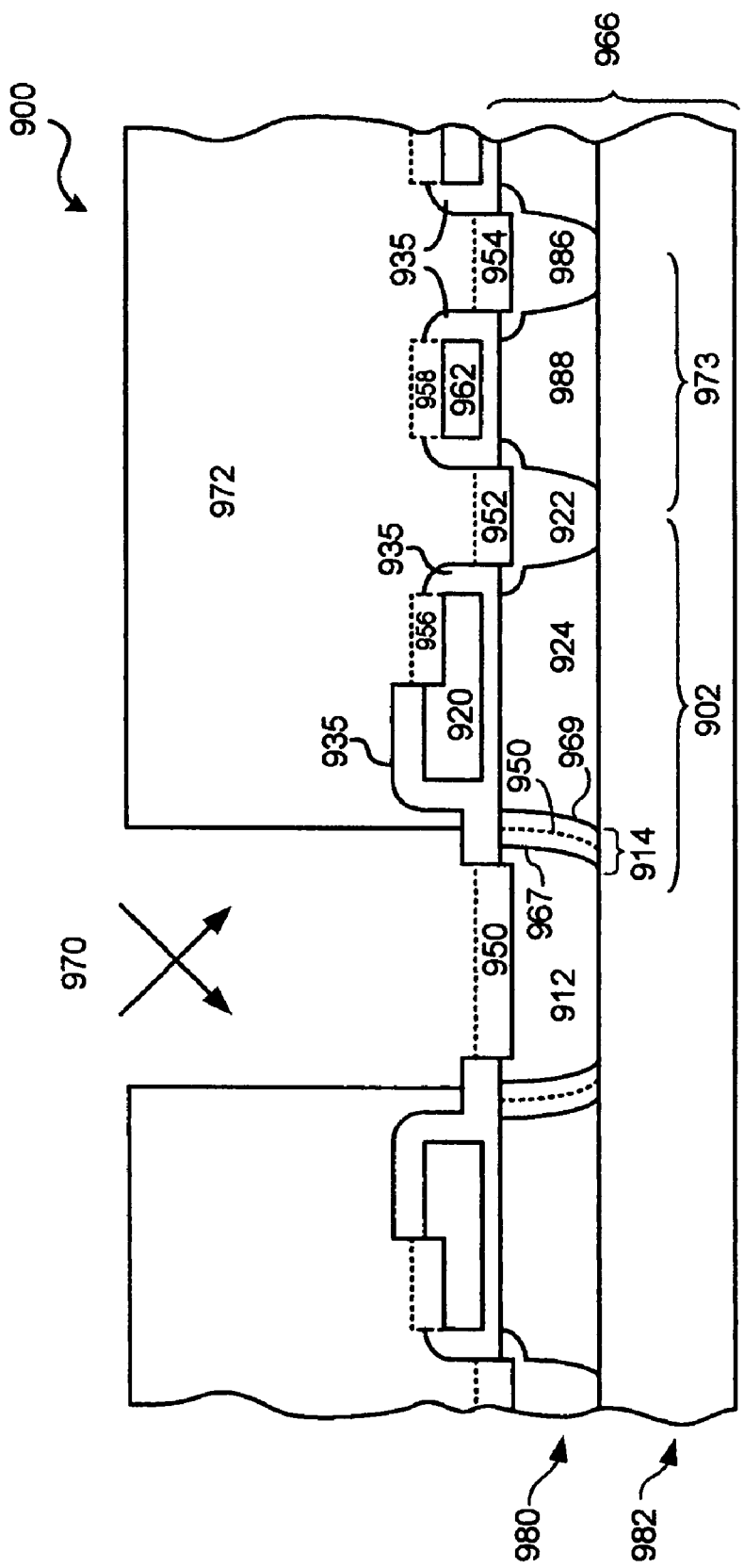
FIG. 9C is a cross sectional view of a portion of a semiconductor substrate useful to further describe a method of fabricating a thyristor memory for an embodiment of the present invention, showing an implant of lifetime adjustment species to form a low-level leakage region, and also showing silicide that may be formed over particular regions for the thyristor memory.

Referencing FIG. 9C, memory device 900 (630 of FIG. 6) in accordance with an embodiment of the present invention may comprise capacitively-coupled thyristor 902 (642 of FIG. 6) disposed electrically in series with access transistor 973 (640 of FIG. 6). The thyristor and access transistor may be formed in a layer of silicon 980 disposed over an insulator 982 of, e.g., an SOI substrate 966. Extending laterally, thyristor 902 may comprise, anode-emitter region 912, N-base region 914, P-base region 924 and cathode-emitter region 922. The cathode-emitter region 922 may be formed in common with and as part of the drain/source region of access transistor 973, which may comprise and be described alternatively as a MOSFET. Electrode 962 may serve as the gate over the body or channel region 988 of MOSFET 973, and may be insulated from the channel region by a dielectric such as an oxide. The gate electrode to the MOSFET may be operable under bias to effect an electric field in body region 988. Dependent on the electric field influence (e.g., by activation of wordline 620 of FIG. 6), a conductive channel may be formed between drain/source region 922 and source/drain region 986. Such enabling of MOSFET 973 may allow access to thyristor 902.

Although they are not shown specifically in FIG. 9C; contacts and conductive lines may be formed over and integrated with the thyristor memory. For example, a reference voltage contact may be formed to contact an anode-emitter region of the thyristor. This contact may electrically link the anode-emitter region to a conductive line that may be disposed (as part of a multi-level metal structure) over the semiconductor substrate and electrically operable to receive a bias voltage. Likewise, a bitline (not shown) may be disposed over the substrate as part of the metal layers or conductive lines for the memory array and may be coupled to the source/drain region of an access transistor on a side thereof opposite the thyristor. This bitline may be electrically configured to transfer data signals between the thyristor cell and read/write circuitry of the memory device.

In some embodiments, the MOSFET 973 and thyristor 902 may be formed in a SOI substrate. Such devices may show lower parasitic junction capacitances, better on/off isolation and better sub-threshold swings in comparison to their bulk counterparts. But, because of the thin silicon layer of the SOI structure, these devices may use silicide to lower the resistance of certain regions. For example, thyristor memory 900 as represented by FIG. 9C, may comprise anode-emitter region 912 and cathode-emitter region 922 (in common with drain/source regions), source/drain region 986, and also electrode 920 of thyristor 902 and gate electrode 962 of MOSFET 973 formed with respective silicide regions 950, 952, 954, 956, 956, 958.

During the formation of the silicide regions, temperatures may be used of magnitude sufficient to diffuse metal into the silicon. Although the magnitude of the siliciding temperature (e.g., 600 degrees Celsius) may be lower than those for activating dopants (e.g. 1050 degrees Celsius), these silicide anneal temperatures may, for certain embodiments, affect boundaries for the different implant regions of the thyristor and/or MOSFET. Accordingly, certain embodiments may provide for structures and fabrication methods capable of accommodating the magnitude of the anneal temperatures and/or durations (i.e., thermal budget) so as to control the migration of implants. Embodiments may also use geometries sufficient to accommodate deviations in implant diffusion, as may be affected by the dopant activation(s), silicide anneals and/or other temperature exposures.

Turning back with reference to FIG. 7, low-lifetime region 750 may be formed by implant of lifetime adjustment species. These species may be annealed separately, and/or together with activation (high temperature anneal) of dopant implants and/or annealing for silicide formation. Accordingly, for some embodiments, the implant of lifetime adjustment species may be performed in a late stage of the fabrication process with an aim to control the extent of possible diffusion and boundary shifts therefor. In accordance with other embodiments, carbon may be used for the lifetime adjustment species and may be implanted in an early stage of the overall fabrication process rather than later. Further, the implant of carbon for the lifetime adjustment species may be self-aligned relative to and using mask(s) the same as those used during patterning of base and anode-emitter regions for the thyristor.

In further embodiments, the carbon implants for the lifetime adjustment may be annealed at temperatures associated with dopant activation. The high temperature of the activation anneal may serve as one of the primary controlling parameters of the lifetime adjustment. The concentration of the carbon implants may also serve as another controlling parameter for establishing the leakage or lifetime properties within the low-lifetime region. With such embodiment(s), it may be appreciated that the embodiments with the carbon implants may be reasonably robust to other thermal cycles (which may have temperatures substantially less than that of the dopant activation) through a remainder of the device fabrication. By such leakage controlling effects of the high temperature activation, the other lower-level thermal procedures may have nominal affect over the resulting leakage characteristics. This may allow for greater predictability in the resulting characteristics of the devices produced and perhaps assist a greater production yield.

Figure 10:
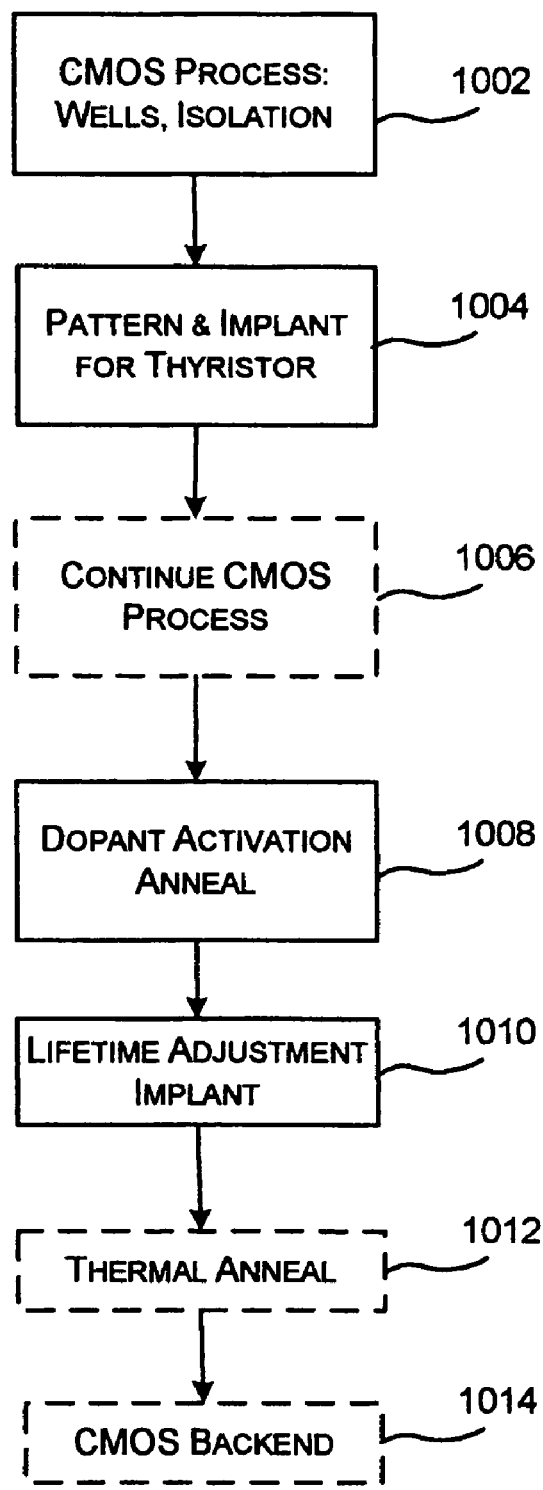
FIG. 10 is a simplified flow chart useful for describing a method of processing a thyristor memory in accordance with an embodiment of the present invention, and showing a lifetime adjustment implant and anneal at a late stage in the fabrication flow.

Referencing FIG. 10, a method of processing a semiconductor device (method 1000 of FIG. 10) may begin by forming the opposite conductivity well regions within a substrate to form first and second active regions. For example, a (bulk) semiconductor substrate may initially comprise a P-type semiconductor material and a first active region may be defined by implanting N-type dopant for the formation of an N-well within the semiconductor material. Additionally, an isolation trench might also be formed between the different active region(s). These initial procedures may be understood to be represented within block 1002 of the simplified flow chart of FIG. 10—e.g., the CMOS process for the formation of wells, isolation, etc. Further, it may be understood that the procedures of block 1002 might also be representative of initial CMOS processes for an SOI substrate (966 FIG. 9A).

Referencing FIG. 9A, dielectric may be formed over a layer of silicon of SOI substrate 966, as may be incorporated as part of the preliminary "CMOS Process" (block 1002 FIG. 10). The dielectric may be formed as a thermal oxide anbe described alternatively as a gate oxide or gate dielectric. d may Conductive polysilicon may then be patterned thereover to define electrodes 920, 962. One electrode 962 may be for the gate of MOSFET 973 and the other electrode 920 may be for the capacitor electrode associated with the capacitively-coupled thyristor. The electrode 962 for the MOSFET gate may be formed in insulated relationship over a gate oxide and over body region 988. The electrode 920 for the capacitively-coupled thyristor may be formed in insulated relationship over a base region for the thyristor. The capacitor electrode may be described as capacitively-coupled thereto via the dielectric (e.g., a thermal or gate oxide or other insulator). In one example, the dielectric may be formed with a thickness of between 5 nm and 30 nm; more typically about 10 nanometers. The polysilicon for the electrodes may be formed with a thickness of between about 80 nm and 1000 nm, and typically around 200 nanometers.

Further referencing FIG. 9A, photoresist 971 may mask portions of the substrate to be associated with where some of the thyristor regions may be formed. The other regions for the CMOS device may be then processed (block 1002 of FIG. 10) to define, e.g., at least parts for access transistor 973. Initially, N-type extension regions 976, 978 (e.g., for lightly doped drain or LDD regions) may be formed about gate electrode 962. In one embodiment, the implants for the extension regions may be formed using phosphorous with an implant dosage of about $8 \times 10^{14}$ per $cm^2$. Additionally, it may be understood that these extensions may be formed before development of sidewalls 935.

Halo implants might also be formed around the gate electrodes—i.e, between or proximate the extension regions 976, 978 and the body region. In a particular embodiment, the halo implants may be formed with, e.g., boron implanted with a given implant angle.

Although particular magnitudes may be described for the doping levels, material thickness, extents and dimensions for given embodiments; it will be understood that these magnitude may be merely exemplary and that alternative magnitudes may be available therefore—e.g., alternative parameters for the oxide thickness, implant species or densities as may be used for defining these devices of alternative specifications. For example, in some embodiments, substrate 966 may comprise an SOI substrate with a silicon layer of about 1000 angstroms. The gate dielectric may comprise a thermal oxide of about 2 nanometers, and the N-type extension regions may be formed from a species of arsenic implanted with, e.g., a 7 degree angle.

After defining the extensions and halos, a dielectric such as nitride may be formed conformal to and over the substrate and electrodes. An anisotropic etch may be used to etch the dielectric and form sidewall spacers 935 against sidewalls of the electrodes. In some embodiments, sidewall spacers may be formed while masking regions of the substrate for the thyristor.

Next referencing FIG. 9A, N-type species may be implanted to form the deeper level source and drain regions 922, 986 (referencing FIG. 9B) about gate electrode 962. In a particular embodiment, these deep implants may use species such as arsenic. In one example, the implant for the source/drain regions may use an energy and dosage to penetrate a full depth of the layer of silicon 980 of SOI substrate 966, e.g., energy of about 40 keV and dosage of about $2 \times 10^{15}$ ions per centimeter square.

In alternative embodiments of the present invention, the deep level implants may be performed in a later stage of the fabrication flow, e.g., block 1006. For such embodiment, the thyristor implants for N-base region 914, anode-emitter region 912 and lifetime adjustment may be performed before the implants to the deep level regions.

In yet a further embodiment of the present invention, the deep level implants for the source/drain regions for the MOSFET may be performed in-situ or in common with the implants for formation of anode-emitter region 912.

Returning with reference to FIGS. 9A-9B, mask 971 may be removed and additional photoresist 977 layered and patterned to assist formation of the base and anode-emitter regions for the thyristor (block 1004 of FIG. 10). Using photoresist 977 as an etch mask, regions of dielectric may be removed, e.g., from between the electrodes of two different thyristor devices and about mirror axis 904. For example, an etch, such as an anisotropic etch, may be used to remove the exposed regions of dielectric and to clear corresponding portions of the layer of silicon of substrate 966 as defined by the window through photoresist 977. The etch may form a shoulder to dielectric 935, adjacent and extending laterally outward from electrode 920 toward the anode-emitter region. In one embodiment, the lateral extent of the shoulder may comprise a distance greater than its conformal thickness. In a further embodiment, it may comprise a distance sufficient to form an N-base region (e.g., lateral width of up to about 100 nm) therebelow and with a lateral offset relative to a peripheral wall or edge of electrode 920.

Further referencing FIG. 9B, patterned dielectric 935, and photoresist 977 may be used collectively as an implant mask during formation of N-base region 914 and anode-emitter region 912. For Example, an implant 975 for the formation of the N-base region may use a species such as phosphorous, with an implant angel of about 30 degrees (relative to the horizontal), energy of about 60 keV, and dosage of about $4 \times 10^{14}$, twisted. It will be understood, that the specifics for the implant species, angle and energy in combination with the lateral extent of the implant mask may be selected with parameters sufficient to define boundary 969 for N-base region 914 beneath the shoulder of dielectric 935 that may be laterally offset from capacitor electrode 920.

For example, in another embodiment, the implant for the N-base may use an implant species of arsenic, an implant angle of about 30 degrees, energy of about 10 keV, and dosage of about $1 \times 10^{15}$ per centimeter square, twisted.

Further referencing FIG. 9B, after performing the N-type implant for N-base region 914, the same mask may be used during implant of P-type species to form anode-emitter region 912.

In one embodiment, a species of boron may be used with an energy of about 9 keV, implant angle of less than about 4 degrees (relative to the vertical axis) and a dosage of at least $3 \times 10^{16}$ per centimeter square, twisted. Again, these levels are representative of simply one embodiment.

After implanting regions for N-base 914 and anode-emitter region 912, photoresist 977 may be removed. As mentioned previously, in accordance with some embodiments of the present invention, the deep level implants (1006 of FIG. 10) for source/drain regions 922,986 of MOSFET 973 may be performed after the implants (block 1004 FIG. 10) for definition of the base, anode-emitter and lifetime adjustment regions for thyristor 902.

In other embodiments, the deep level source/drain regions may have already been formed and fabrication may continue with implanting of the lifetime adjustment species. For such embodiments, an anneal for the dopant activations may use temperatures, e.g., 1050 degrees Celcius, greater than those tolerable by typical photoresist. Accordingly, for the lifetime adjustment implant to use the same mask for the alignment and definition of the extent for the lifetime adjustment region, the implant species selected (e.g., carbon) may need to tolerate the high temperatures that may be associated with the dopant activation anneal and, at the same time, lend leakage qualities for thyristor stability.

For an embodiment with the lifetime adjustment implant performed after dopant activation, after completing the implantings (block 1006 FIG. 11) for the source/drain regions of MOSFET 973, an activation anneal (block 1108 FIG. 11) may then be performed to activate the previously doped regions for MOSFET 973 and thyristor 902. In one such embodiment, the activation anneal may comprise a temperature of between 900 and 1200 degrees Celsius; and in a particular embodiment, around 1050 degrees Celsius. This anneal may last for a duration greater than 5 seconds, and in a given embodiment, about 10 seconds.

Moving forward with reference to FIG. 9C, additional photoresist 972 may be formed over the substrate and patterned to protect select regions of the substrate—e.g., as may be associated with the access transistor 973. A lifetime adjustment implant 970 may then be performed (block 1010 FIG. 11) to form a low-lifetime region of the thyristor. In this embodiment, the lifetime adjustment implant species may be aligned relative to the peripheral edge of the shoulder of dielectric 935. Alternatively, the adjust implant may be self-aligned relative to the peripheral edge(s) of photoresist 972 and/or collectively with dielectric 935.

Represented by dashed line 950 of FIG. 9C, the boundary of the lifetime adjustment implant may extend to overlap junction 967 between anode-emitter region 912 and N-base region 914. But, the extent therefore may remain substantially clear of boundary 969 between N-base region 914 and P-base regions 924. The implant for the lifetime adjustment may use an ion species of the group consisting of metal, column IV and/or column VIII of the periodic table. For example, the lifetime adjustment species could comprise ion(s) of germanium (Ge) and xenon (Xe).

In a particular embodiment, implant 970 may use a species of carbon, an implant energy of about 13 keV, angle of 45 degrees, and dosage of about $5 \times 10$ . atoms per centimeter square, twisted. Being twisted, shadowed regions may thus receive an effective dosage of about one-half that of the overall dosage. In other words, for this example, regions beneath an edge of a mask may receive a dosage of about $2.5 \times 10^{15}$ atoms per centimeter square.

Further referencing FIGS. 9C and 10, after the lifetime adjustment implant, an anneal may be performed (block 1012 FIG. 10) to repair some of the damage sites within the silicon, which may have resulted from implant bombardment. For example, when implanting ions of the column IV or column VIII materials of the periodic chart into the silicon region, some of these implants may comprise sufficient bombardment energy to transform regions of the lattice structure of silicon into poly. In particular procedures, after the bombardment, an anneal might then be performed to restore some of the damaged regions. In further embodiments, the temperature and the duration of the anneal may be selected appropriately to repair some, but not all regions. Accordingly, residual polycrystalline regions may remain and may be present across the emitter-to-base junction. These residual polycrystalline regions, in turn, may affect the lifetime of minority-carriers and/or may allow low-level current leakage across the junction during operation of the thyristor.

Figure 11A:
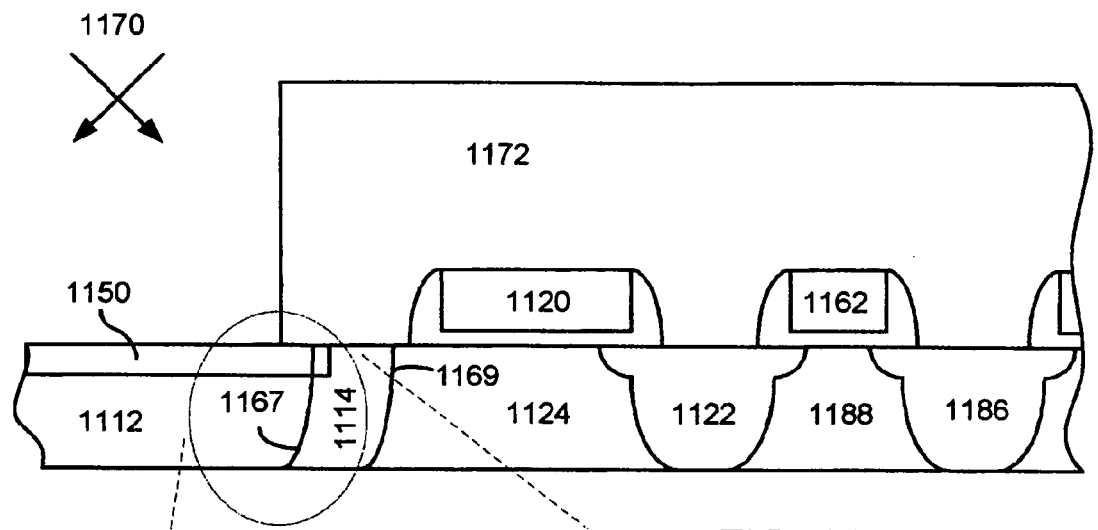
FIG. 11A is a cross sectional view of a portion of a semiconductor device in a stage of processing, useful to describe a method of processing a semiconductor device for another embodiment of the present invention, and showing alignment of base, emitter and lifetime adjustment implants for a thyristor relative to a mask.
Figure 11B:
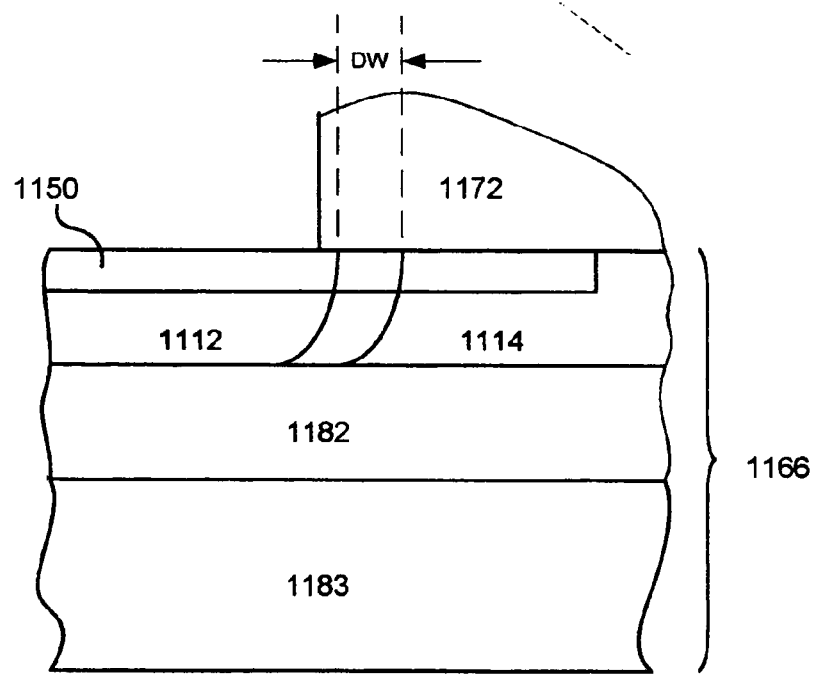
FIG. 11B is a cross sectional and exploded view of a portion of a semiconductor device showing a depletion region between an emitter region and a base region of a thyristor device.

Referencing FIGS. 11A and 11B, gate electrode 1162 may be formed over a body region 1188 to a MOSFET device and capacitor electrode 1120 may be formed over a base region 1124 for a thyristor. In the previous stages of the fabrication, extension and halo regions for the MOSFET device may be implanted while masking regions of the silicon layer for the thyristor. After forming the extension regions, spacers may be defined against sidewalls of the electrodes. In one embodiment, deep level implants 1122,1186 for the source and drain regions of the MOSFET may be formed before the implants for the thyristor N-base region 1114, anode-emitter region 1112 and low-lifetime region 1163. In alternative embodiments, the deep level implants may be performed after the implants for the thyristor. Typically, the deep level implants may penetrate a full depth of silicon layer 1180 of an SOI substrate. It may be understood that silicon layer 1180 may be disposed over buried oxide 1182 of SOI substrate 1166. The substrate may further comprise supporting material 1183 (e.g., silicon wafer) to support buried oxide 1182 and silicon layer 1180.

Further referencing FIGS. 1A and 1B, photoresist 1172 may be formed over the silicon layer and electrodes. The photoresist may comprise, e.g., a deep-UV reactive type resist and, for one embodiment, depth of about 0.25 microns. The resist may be patterned to assist alignment of implants for definition of N-base region 1114, anode-emitter region 1112 and/or low-lifetime region 1150. In a further embodiment, an implant for N-type dopant for N-base region 1114 may use an implant angle of about 30 degrees relative to the horizontal. P-type dopant for the anode-emitter region 1112 may use an implant angel of within about 10 degrees of 90 degrees relative to the horizontal (i.e., + or −10 degrees of the perpendicular axis). The lifetime adjustment species may be implanted with an angle greater than the angle of implant that was used for the base region, but less than that which was used for the anode-emitter—e.g., in a particular embodiment, an implant angle of about 45 degrees relative to the horizontal may be used for the implant of the lifetime adjustment species. For such implant, the species, dosage, energy, and/or anneal temperature and anneal duration may be selected appropriately to assure that at least some lifetime adjustment sites may be formed across a depletion region DW for the junction 1167 between anode-emitter region 1112 and N-base region 1114.

It may be assumed that the width of depletion region DW of junction region 1167, referencing FIGS. 11A and 11B, may depend on the doping levels on either side thereof. In certain embodiments, the depletion width may comprise a magnitude of from tens to hundreds of nanometers. Thus, the implant for the lifetime adjustment may select species, implant energy and dosage sufficient to achieve concentration/impacts in the depletion region to reliably affect its low-level leakage characteristics. In some embodiments, the parameters for the lifetime adjustment implants may be selected to establish a leakage characteristics across the junction substantially greater—e.g. at least two times greater—than that for the junction absent the adjustment species.

Further referencing FIG. 11B, as the size of memory devices shrink; the size (area and/or volume) of the depletion region DW between the emitter region 1112 and the base region 1114 may impact a reliability of device fabrication. It may be theorized that for a given type of lifetime adjustment implant, a probability of achieving low-level leakage affects across junction 1167 may depend on various parameters, such as the area or volume available in the depletion region for receiving a damage site, an average size of the damage sites, and also their density or distribution. For thyristor memory devices of large geometry (e.g., an N-base area of 100 nm×10 um), a variety of different implant species (e.g., of metal, column IV and column VIII) and/or methods of implant may be effective to reliably avail lifetime adjustments for low-level leakage effects across the junction. However, at some geometries (e.g., an N-base area less than 100 nm×180 nm), the type of species and its method of implant and anneal may be selected more carefully in order to allow for more reliable lifetime adjustments and device fabrication.

For purposes of the present disclosure, it may be useful to theorize that certain types of lifetime adjustment implants of damaging type impact may form relatively large "macro" defects. These might be measured, e.g., with an average diameter of about 1 to 10 nm.

For other types of lifetime adjustments, carbon, e.g., may be used as a lifetime adjustment species and may be implanted and/or annealed to form lifetime adjustment sites of "micro" defects. These "micro" defects may be described with an average diameter less than the "macros"—e.g., less than 1 nm. By such "micro" defects and an appropriate density therefor, leakage affects might be more reliably established across depletion regions of small geometry. In one example, carbon may be implanted sufficiently for achieving a density thereof of about $10^{19}$ atoms per centimeter cube.

Figure 12:
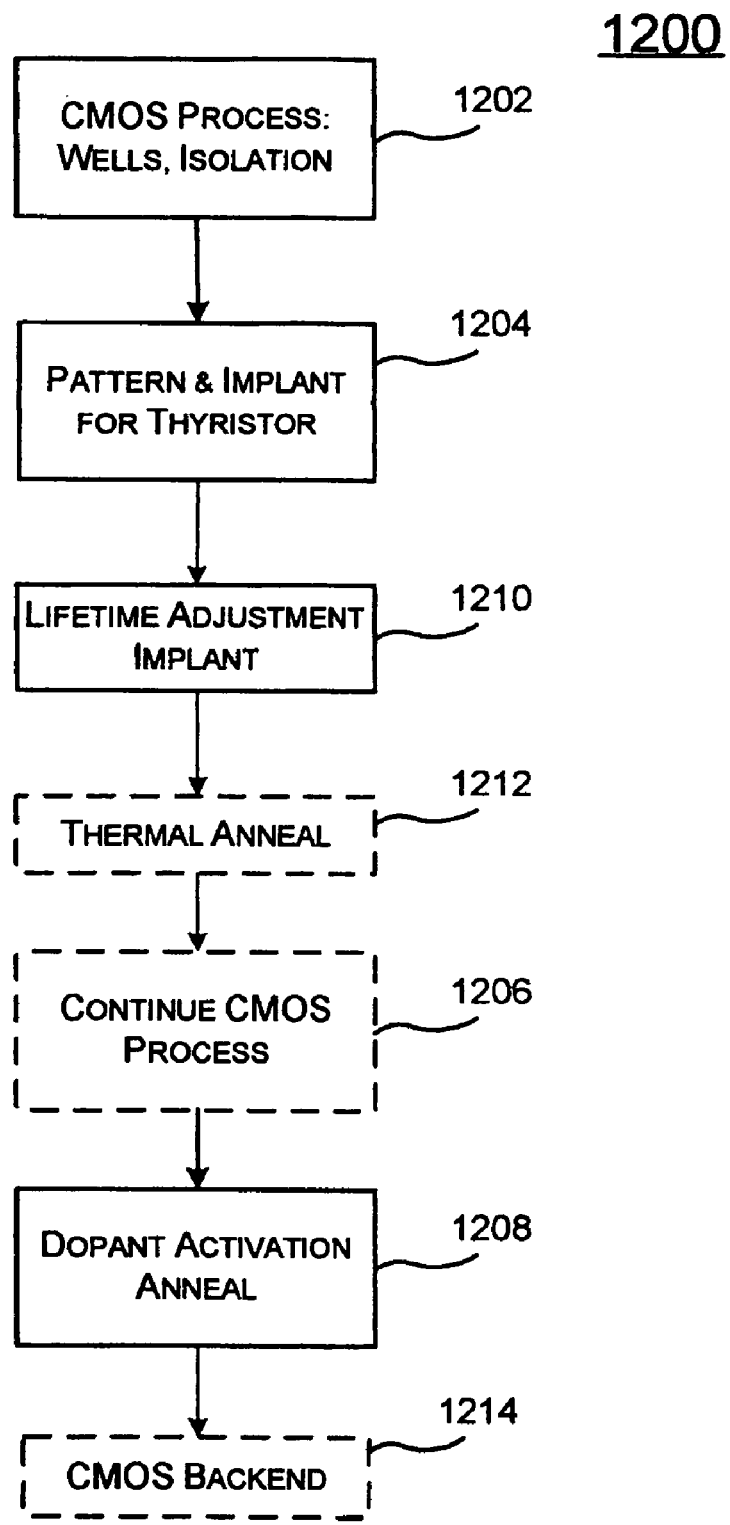
FIG. 12 is a simplified flow chart useful for describing a method of processing a thyristor device in accordance with another embodiment of the present invention, and showing lifetime adjustment implant and anneal at an early stage in the fabrication flow.

Referencing FIGS. 11A and 12, another particular method 1200 of forming a thyristor memory may implant (block 1210 FIG. 12) lifetime adjustment species into a low-lifetime region 1150 after performing preliminary CMOS processes (block 1202) and after performing implants (block 1204) for thyristor N-base and anode-emitter regions. In one such embodiment, the lifetime adjustment implant may use carbon implanted with an energy of about 13 keV, 45 degrees tilt and dosage of about $5 \times 10^{15}$. In a particular case, the deep level implants for the MOSFET source and drain regions may have already been performed and fabrication may then continue with temperature anneal(s) (blocks 1212,1208). For some alternative embodiments, the deep level implants for source and drain regions 1022,1086 may be performed (block 1206) after the thyristor implants and before the anneals.

Further referencing FIG. 12, in accordance with a further embodiment, a single anneal may be used to anneal, collectively, the lifetime adjustment implants and to activate/anneal dopants that have been implanted into the different N-type and P-type regions of the MOSFET and thyristor devices. For example, the anneal may use a temperature of between 600 and 1200 degrees Celsius. In a particular example, the anneal may use a temperature of about 1050 degrees Celsius and an exposure duration of about 10 seconds to both activate dopants and to form the lifetime adjustment sites.

In the event additional duration or temperature may be needed for the lifetime adjustment anneal, it may be performed (block 1212) before other CMOS processes (block 1206) and logic device dopant activation (block 1208).

Figure 13A:
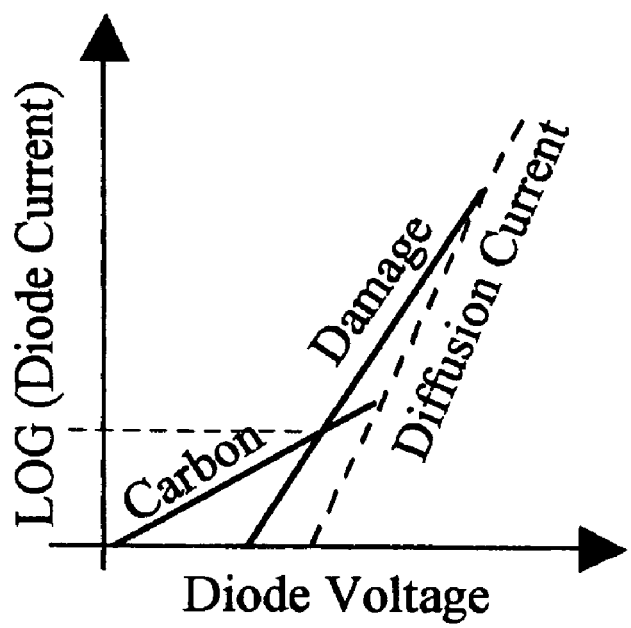
FIGS. 13A and 13B show current-voltage and gain-current curves useful for developing an understanding of characteristics for certain embodiments of the present invention.
Figure 13B:
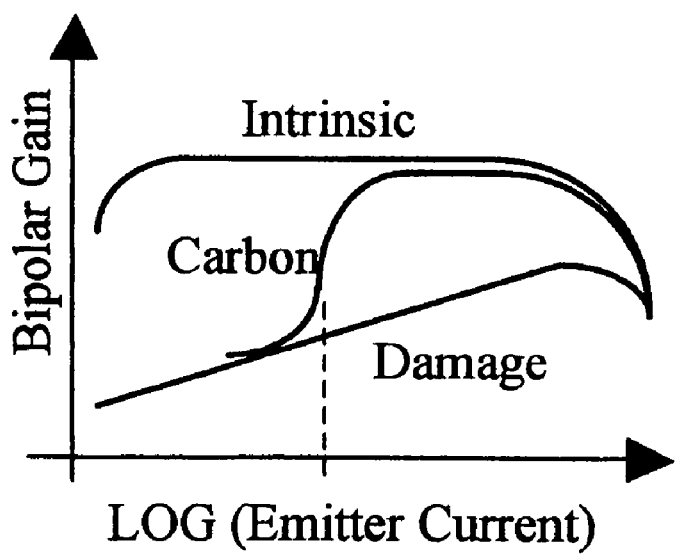

Referencing FIGS. 13A and 13B, in accordance with various embodiments of the present invention, the thyristor performances thereof may be better understood relative to the different current-voltage curves of FIG. 13A and/or the different gain-versus-current curves of FIG. 13B. An ideal thyristor device, absent lifetime adjustment implants, might show ideal current diffusion characteristics across its base-emitter junction regions, as represented by the "Diffusion Current" curve. Likewise, it might also exhibit essentially ideal bipolar gain properties over its range of current levels, as represented by the curve labeled "Intrinsic" in FIG. 13B.

For some embodiments of the present invention, e.g., per methods of fabrication described previously herein relative to FIG. 10 and/or for those using lifetime adjustment species other than carbon, the base-emitter junction regions may generally show or be characterized by a leakage component which persists across the majority of the bias range—e.g., as represented by the curve labeled "damage" in FIG. 13A. The leakage properties, in turn, may impact and dominate the affects for a bipolar gain for the thyristor, wherein the thyristor may show a bipolar gain-versus-current property as represented simplistically by the curve labeled "damage" in FIG. 13B. Essentially, it may be observed or speculated that in the bias region where the leakage current component dominates, the gain for the bipolar transistor may similarly be degraded. It may be noted that the current axis in the graphs of FIGS. 13A and 13B are scaled logarithmically.

For some other embodiments of the present invention, e.g., per methods of fabrication described previously herein relative to FIG. 12 and/or those that may use carbon for the lifetime adjustment species, the base-emitter junction region may be characterized over a first current range with a low-level leakage that may be dominated by the carbon implant component, as represented by the curve labeled "Carbon" in FIG. 13A. At some point, or some bias level, the carbon implant leakage current may comprise a magnitude comparable to that of the ideal diode curve (Diffusion Current). At about this level of bias, the bipolar device may show a transition in its gain, (see the curve labeled "Carbon" in FIG. 13B). The gain may transition from a low or degraded level to a higher-level gain at around the bias region where the magnitude of the carbon effected leakage is comparable to that of the ideal diode. In other words, the slope of the log (current) vs. voltage curve for the junction with the carbon-type implant may be relatively "flat" through a low bias region. But, the slope therefor may approach that of an ideal (diffusion) current through the higher bias levels. Likewise, the bipolar junction transistor of the thyristor that may incorporate the carbon implanted base-emitter junction may show a suppressed gain over the low current levels and a nearly ideal or intrinsic gain characteristic over the higher current levels. This transition in gain may be viewed to further assist stability of the thyristor, even beyond that which may already be offered by the flat leakage effects. It may be noted that this type of gain-leakage characteristic may offer an immunity to noise for the thyristor when holding a zero state via the low-level leakage at the lower bias region. At the same time, it may not degrade retention of data for the device when retaining a one state via the near-intrinsic gain beyond the transition region. Compared with the previously-discussed embodiment, a lower-holding current may be used during retention of the one-state.

Further referencing FIGS. 9C, 11 and 12, after forming the lifetime adjustment region(s) and the implant regions of the MOSFET and thyristor, backend CMOS processing may proceed (blocks 1014 of FIGS. 11 and 1214 of FIG. 12). For example, photo-resist 972 may be removed for leaving patterned dielectric 935 as a mask. For this embodiment, the dielectric may serve as a silicide block. In some embodiments, the dielectric may comprise, e.g., nitride of a thickness greater than 90 angstroms. Metal such as tungsten, nickel, cobalt, platinum, titanium or other refractory metal may then be deposited over the dielectric masked substrates. A heat treatment may then diffuse metal of the deposited metal into select regions of the layer 980 semiconductor material and also select regions of the electrodes. After diffusing the metal (siliciding) into the select regions of semiconductor material as defined by the dielectric mask, unreacted portions of the metal may then be stripped. In a particular example, the residual metal may be stripped using an acid bath, leaving silicide 952,954 on at least portions of the drain and source regions of MOSFET device 973, and silicide 956,958 on at least portions of electrodes 920,962 respectively.

After siliciding the exposed regions, additional backend processing of the semiconductor device may continue for interconnecting the different devices and transistors with other elements (not shown) of the semiconductor device. Through such additional backend processing, e.g., insulating materials may be formed over the structures and appropriate conductive interconnects patterned to respective contacts of the gates, electrodes, source/drain regions and/or emitter regions for forming the overall integrated circuit, such as a memory integrated circuit.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and shunts; adding structures to the integrated circuit device; increasing the number of P-N sections in the thyristor device; and interchanging P and N regions in the device structures and/or using P-MOSFETS rather than N-MOSFETS. Such modifications and changes do not depart from the true spirit and scope of the present invention that may be set forth in the following claims.

What is claimed is:

1. A method of fabricating a semiconductor device, comprising:

forming a thyristor in a semiconductor material, the thyristor comprising anode, N-base, P-base and cathode regions, the thyristor having a first junction region between the anode and N-base regions, a second junction region between the N-base and P-base regions, and a third junction region between the cathode and P-base regions; and implanting leakage species into a region of the semiconductor material that includes at least one of the first and the third junction regions while substantially clear of a second junction region.

* * * * *